United States Patent
Vella et al.

(10) Patent No.: US 10,381,742 B2
(45) Date of Patent: Aug. 13, 2019

(54) INTEGRATED INFRARED OPTICAL ANTENNA AND POLARONIC ORGANIC TRANSDUCER SENSOR

(71) Applicant: The United States of America, as represented by the Secretary of the Air Force, Washington, DC (US)

(72) Inventors: Jarrett H Vella, New Carlisle, OH (US); John S Derov, Beavercreek, OH (US); Mohammad I Vakil, Beavercreek, OH (US)

(73) Assignee: The United States of America, as represented by the Secretary of the Air Force, Washington, DC (US)

( * ) Notice: Subject to any disclaimer, the term of this patent is extended or adjusted under 35 U.S.C. 154(b) by 280 days.

(21) Appl. No.: 15/422,497

(22) Filed: Feb. 2, 2017

(65) Prior Publication Data
US 2018/0219302 A1 Aug. 2, 2018

(51) Int. Cl.
*H01Q 21/30* (2006.01)
*H01Q 21/06* (2006.01)
*H01Q 1/48* (2006.01)
*H01Q 9/04* (2006.01)
*H01Q 21/00* (2006.01)
*H01L 21/00* (2006.01)
*H01L 51/00* (2006.01)

(52) U.S. Cl.
CPC .......... *H01Q 21/065* (2013.01); *H01L 51/00* (2013.01)

(58) Field of Classification Search
CPC .............................. H01Q 21/065; H01L 51/00
See application file for complete search history.

(56) References Cited

U.S. PATENT DOCUMENTS 8,230,564 B1 7/2012 Reid, Jr.
2017/0040711 A1* 2/2017 Rakib .................... H01Q 1/246

OTHER PUBLICATIONS

Y. Furukawa, "Electronic Absorption and Vibrational Spectroscopies of Conjugated Conducting Polymers," J. Phys. Chem. 100, 15644 (1996).
Alvi et al., "Graphene-polyethylenedioxythiophene conducting polymer nanocomposite based supercapacitor," Electrochimica Acta 56, 9406 (2011).
Rutledge et al., "Infrared and Submillimetre Antennas," Infrared Phys. 18, 713 (1978).

(Continued)

*Primary Examiner* — Seahvosh Nikmanesh
(74) *Attorney, Agent, or Firm* — AFMCLO/JAZ; Charles Figer, Jr.

(57) ABSTRACT

An antenna array is provided including a substrate, a metal ground plane proximate the substrate, and a dielectric layer proximate the metal ground plane. A first plurality of antenna elements including polaronic organic transducer elements is proximate the dielectric layer and connected in series. A second plurality of antenna elements including polaronic organic transducer elements is proximate the dielectric layer and also connected in series. The first and second plurality of antenna elements are electrically isolated. The antenna elements of the first plurality of antenna elements are configured to detect a first wavelength, while the antenna elements of the second plurality of antenna elements are configured to detect a second wavelength, different from the first wavelength.

7 Claims, 4 Drawing Sheets

(56) References Cited

OTHER PUBLICATIONS

Fumeaux et al., "Lithographic Antennas at Visible Frequencies," Opt. Lett. 24, 1629-1631 (1999).
Gonzalez et al., "Comparison of Dipole, Bowtie, Spiral and Log-Periodic IR Antennas," Infrared Physics & Technology 46(5), 418-428 (2005).

* cited by examiner

INTEGRATED INFRARED OPTICAL ANTENNA AND POLARONIC ORGANIC TRANSDUCER SENSOR

RIGHTS OF THE GOVERNMENT

The invention described herein may be manufactured and used by or for the Government of the United States for all governmental purposes without the payment of any royalty.

BACKGROUND OF THE INVENTION

Field of the Invention

The present invention generally relates to multispectral imaging, detection, and tracking of objects and, more particularly, to an antenna and transducer sensor for the multispectral imaging, detection, and tracking.

Description of the Related Art

Contemporary infrared detectors generally consist of photoconductors, photo-emissive detectors, and photodiodes. Photoconductors absorb photons or light changing their conductance. Photo-emissive detectors consist of an anode and photocathode. A photon hits the cathode and an electron is ejected, which is collected at the anode, producing a current in the detector. A photodiode is rectifying junction, which can produce a voltage or current when a photon is absorbed. Focal plane arrays (FPAs) are arrays of photodiodes that can sense a change in intensity of light across the array, producing an image. Typical Infrared (IR) FPAs are made from semiconducting materials such as mercury-cadmium-telluride (MCT), indium gallium arsenide (InGaAs), and indium antimonide (InSb), among others, which determine the spectral response of the FPA. The FPA is hybridized to a readout integrated circuit (ROIC), from which data is sequentially readout. The readout signal can be processed to form an image, to calculate a trajectory, or to determine a spectral signature of an object. The detectors do not have an inherent capability for wavelength selective detection without external media such as spectral filters and phase and diffraction gratings. Moreover, the high cost of quality MCT, InGaAs and InSb FPAs becomes prohibitive for very large area infrared detectors. Additionally, the capacitance of each detector pixel is directly related to its size and presents challenges for accurate, extremely fast (sub-nanosecond) object tracking. Thus, to achieve a good signal-to-noise performance and a very fast response, contemporary detectors may also require cryogenic cooling to assist in preventing thermal generation of charge carriers.

Contemporary sensing systems require detection of multiple wavelength bands in the visible and infrared regions, among others. Visible imaging is commonly accomplished using silicon charge capture devices (CCDs), while imaging in the infrared region is commonly accomplished using MCT, InSb, and InGaAs cameras. All of the infrared detectors require a detector array cooled thermoelectrically or cryogenically. Both options have limitations with regards to cost, time, and performance. The ROIC adds considerable weight and cost to the detector; cryogenic and thermoelectric cooling limit platform mission time and increase power consumption, respectively. Based on well known, established technologies, these detectors are also susceptible to an array of countermeasure systems, do not have inherent wavelength-selective detection, and require complex signal processing algorithms for object tracking.

Accordingly, there is a need in the art for a means of object tracking with sub-nanosecond time resolution using a detector inherently capable of wavelength-selective detection and without expensive detector materials that require cryogenic cooling.

SUMMARY OF THE INVENTION

Embodiments of the integrated sensor address the need in the art by providing an inexpensive, high speed, ambient temperature, and spectrally selective sensor. In some embodiments, an antenna element is utilized having a first antenna component, a graphene layer proximate the first antenna component, a doped, conjugated organic polymer proximate the graphene layer, and a second antenna component proximate the doped, conjugated organic polymer forming an organic polymer capacitor between the first and second antenna components. In some embodiments, configurations of the antenna elements may include dipole, bow tie, log-periodic, Yagi-Uda, and patch configurations, among others. In some of these embodiments, the first and second antenna components form connections for respective first and second poles of the antenna element.

Additionally, embodiments of the invention also provide an antenna array including a substrate, a metal ground plane proximate the substrate, and a dielectric layer proximate the metal ground plane. A first plurality of antenna elements is proximate the dielectric layer and connected in series. A second plurality of antenna elements is also proximate the dielectric layer and connected in series. The first and second plurality of antenna elements are electrically isolated. Antenna elements of the first plurality of antenna elements are configured to detect a first wavelength. And, antenna elements of the second plurality of antenna elements are configured to detect a second wavelength, different from the first wavelength.

In some embodiments, the antenna array further includes a third plurality of antenna elements proximate the dielectric layer and connected in series. The first, second, and third plurality of antenna elements are electrically isolated. And, in these embodiments, the antenna elements of the third plurality of antenna elements are configured to detect a third wavelength, different from the first and second wavelengths.

In some of these embodiments, a thickness of the metal ground plane may be between 250 nm and 350 nm. Also, in some of these embodiments, a thickness of the dielectric layer may be approximately one quarter wavelength of an operational wavelength region.

Finally, embodiments of the invention additionally provide a system, which includes an antenna array comprising a plurality of rows of antenna elements connected in series, electronics to detect and amplify changes in DC voltages produced by each row of the plurality of rows of antenna elements, and multichannel analog to digital converters in electrical communication with the electronics and configured to digitize data from the electronics. Each row of antenna elements of the plurality of rows of antenna element is configured to detect a unique wavelength with respect to the other rows of antenna elements of the plurality of rows of antenna elements.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Traditionally, antennas are resonant structures designed to be used in radio frequency (RF) detection, but they may also be designed to sense electromagnetic radiation in the 400 nm-3000 nm wavelength range, which is the visible-shortwave infrared (VIS-SWIR) region. Embodiments of the invention including a VIS-SWIR integrated antenna and polaronic organic sensor described herein contain a doped, conjugated, organic polymer-graphene thin film acting as a fast, room temperature signal transducer and a dipole antenna. The antenna acts as a wavelength selective, resonant spectral filter. In some embodiments, the integrated antenna and polaronic sensor may be fabricated in linear arrays of 20 to 40 antenna-polaronic integrated sensors connected in series. This arrangement may produce a sum of the voltages across the integrated sensor array in an array that is the size of a typical FPA pixel. Furthermore, embodiments of the integrated sensor array may be designed to operate at selected VIS-SWIR wavelengths. Signals from each array may be readout by pulse capture hardware and in some embodiments transferred to a sensor specific processing unit to be processed by algorithms that can identify and or track an object from the electromagnetic radiation emitted by that object. Although the sensors may be cooled in some embodiments, the sensors may also operate at ambient temperatures.

Figure 1:
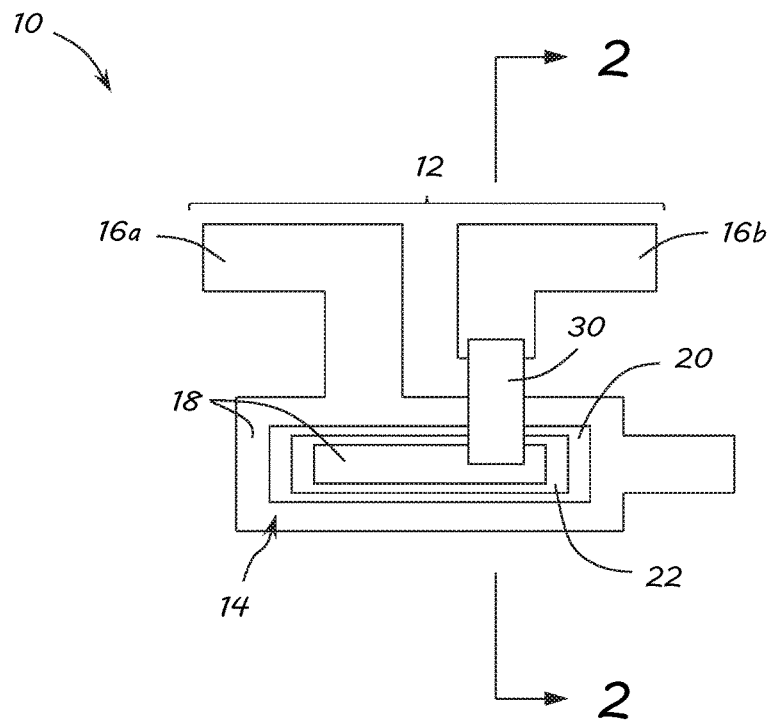
FIG. 1 is a representation of an integrated optical antenna and a polaronic organic transducer sensor.

Antennas may be designed to operate in specific spectral regions. For some embodiments of the invention, the integrated antenna-polaronic organic sensors may be designed for wavelengths in the 400 nm-3000 nm spectral range. Turning now to FIG. 1, an exemplary design of an integrated sensor 10 includes a dipole antenna 12 connected to a graphene (or an electron donating organic molecule) and doped conjugated organic polymer capacitor 14. Each leg 16a, 16b of the dipole antenna 12 is attached to each side of the organic capacitor 14. The capacitor 14 has two metal like layers 18, a graphene layer 20, and a doped, conjugated, organic polymer layer 22, which can be seen in the cross section of the integrated sensor 10 in FIG. 2. The graphene 20 and doped, conjugated, organic polymer layer 22 are between the two metal layers 18, which act as connections for the dipole antenna 12. Light will excite the resonance of the antenna and this resonance excites polaronic species in the graphene-doped, conjugated polymer, creating a potential difference across the capacitor 14. The integrated antenna and polaronic organic sensor 10 may be situated on a dielectric material 24 one quarter wavelength above a ground plane 26 (seen in FIG. 3).

Figure 2:
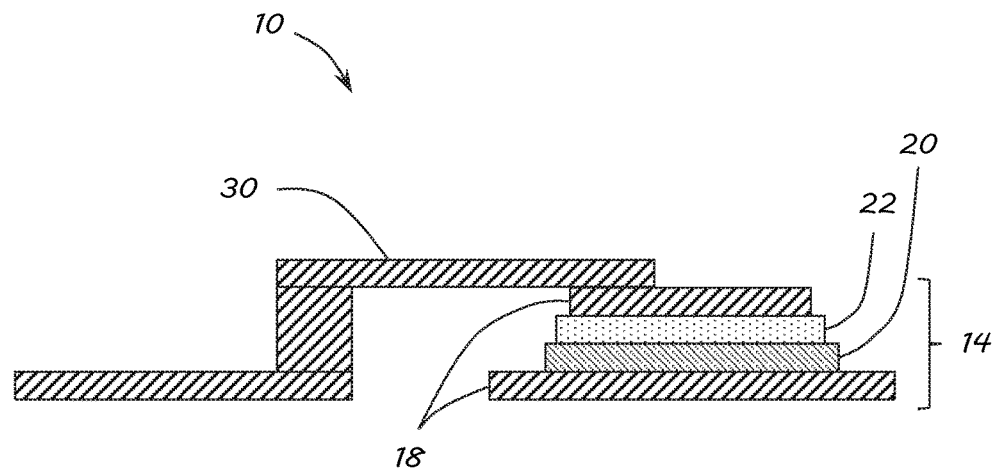
FIG. 2 is a cross section of the integrated optical antenna and a polaronic organic transducer sensor of FIG. 1.
Figure 3:
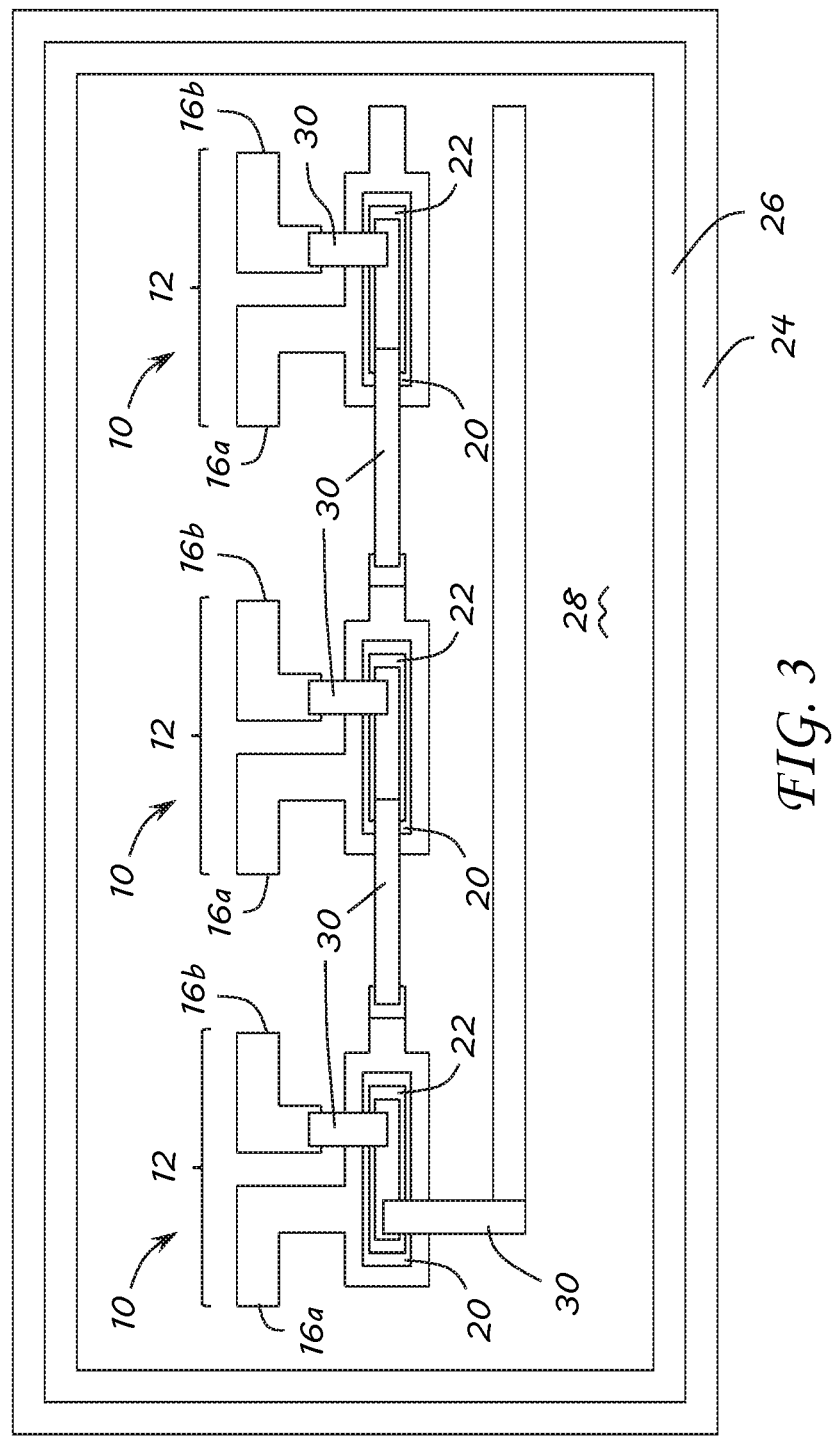
FIG. 3 is representation of a three element, linear array consisting of the integrated optical antenna and a polaronic organic transducer sensors of FIG. 1.

The integrated antenna polaronic organic sensors 10 shown in FIGS. 1-3, are capable of inherently discriminatory detection of selected wavelengths at room temperature. Embodiments employing the integrated sensor arrays may also have a native object tracking ability using simpler signal processing algorithms. As a result, the complexity of wavelength selective detection and object tracking may be reduced while the operating temperature of the detector may be increased.

In the illustrated embodiment, the antennas 12 have lengths of approximately one-half of their resonant wavelength, which significantly increases the spatial resolution of detectors in the 400 nm-3000 nm region, compared to contemporary FPA and CCD pixel sizes of 4-20 μm. Actual detector dimensions, made from arrays of antenna-transducer elements, depend on a desired resonance wavelength of the antennas 12, a required spatial resolution of the detector, and a number of wavelength bands to detect, among other factors.

Antenna designs commonly encountered in radiofrequency and millimeter wave communications include dipole, bowtie, log-periodic, Yagi-Uda, patch, among others. These types of antennas may be scaled down for resonance at selected wavelengths between 400 nm-3000 nm. In the illustrated embodiment in FIGS. 1-3, a dipole antenna design is shown, though other embodiments may utilize other antenna designs. To fabricate an antenna array shown in FIGS. 1-3, a substrate 24 material is chosen. The material of this substrate is not critical since no electromagnetic radiation will be propagating through the material. In the illustrated embodiment silicon was used for the substrate. Since the ground plane defines the electrical boundary condition, any substrate may be used that meets the system requirements. A metal is deposited on the substrate 24 to a thickness of 300 nm±50 nm to act as a ground plane 26. The choice of metal for the embodiments will depend on the spectral range of operation of the detector. For the illustrated embodiment gold was used. An aluminum oxide ($Al_2O_3$) dielectric layer 28 is then deposited over the ground plane 26 approximately one quarter wavelength thick at an operational wavelength region of 780 nm-1450 nm. Metal 18 for the bottom dipole antennas and bottom transducer pads is then patterned on the quarter wavelength thick substrate 28. A doped, conjugated organic polymer 20 is deposited on the bottom transducer pad metal 18. Graphene 22 is then transferred or grown on top of the doped, conjugated organic polymer 20. In other embodiments, as an alternative to graphene, any electron donating organic molecule, such as triphenylamine, may also be used. Deposition follows of metallic film 18 to make the top dipole antennas and top transducer pads. Separate conductive air bridges 30 are patterned to connect half of each dipole antenna to the top transducer pad, to connect adjacent integrated sensor elements in series, and to connect integrated sensor arrays to multichannel pulse capture electronics. The conductive air bridges 30 may consist of any electrically non-insulating material. The conductive air bridges in the illustrated embodiment are metallic, though one could also use a semiconductor, etc.

For illustrative purposes, a 1×3 integrated sensor array is shown in FIG. 3, although actual systems will generally have larger numbers of antennas. FIG. 3 is not drawn to scale and the structure is terraced for illustrative purposes to make it easier to see the layered structure. Here, the three element, linear array is depicted solely to illustrate the detector structure and connectivity between adjacent antenna transducer elements. The actual detector dimensions depend on the desired resonance wavelength of the antennas, the required spatial resolution of the detector, and the number of wavelength bands to detect, among other factors. As a reference point, however, each antenna element in this illustrated embodiment is approximately one-half wavelength long.

Polymer polythiophene (PT) is used as a representative doped, conjugated organic polymer in the illustrated embodiment, though other conjugated organic polymers, such as polyfluorene, poly(p-phenylene-ethynylene), poly (p-phenylene), poly(p-phenylenevinylene), polyaniline, poly(thienylene vinylene), and polypyrrole may also be used. The PT is doped with tetrafluoroborate anions ($BF_4^-$) resulting in a positive electrical charge on the PT. Other dopants may also be used, such as perchlorate, chloride, bromide, iodide, sodium, tetra-n-butylamine, and photodoping, depending on the system requirements. For the illustrated embodiment, in its undoped state, the highest occupied molecular orbital (HOMO) of PT is −5.29 eV and that of graphene is −4.5 eV. Generally, for $BF_4^-$ doped PT, this is too high of an energy barrier for a positive charge to migrate from PT to graphene efficiently. However, a thin film of $BF_4^-$ doped PT features an electron transition attributed bipolaron excitation at 1698 nm. Until relaxation occurs, the energy of $BF_4^-$ doped PT is increased to −4.56 eV. This reduces the energy barrier for charge migration, allowing a pair of electrons to transfer to $BF_4^-$ doped PT and a pair of positively charged polarons to transfer to graphene. Thus $BF_4^-$ doped PT acts as a charge donor and graphene acts as a charge acceptor. The resulting movement of charge results in a positive electric voltage in the organic transduction layer.

Figure 4A:
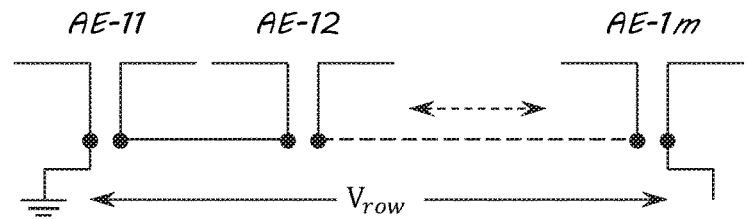
FIG. 4A illustrates a schematic diagram of one row of m antenna elements (AE) with an optically generated voltage, $V_{row}$, across elements AE 11 through AE 1m.
Figure 4B:
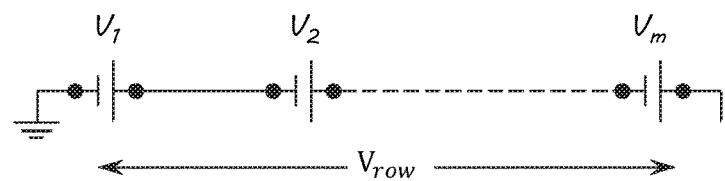
FIG. 4B illustrates a schematic diagram of an equivalent electrical circuit of FIG. 4A where each antenna element acts as a DC voltage source, $V_1$ to $V_m$, which are connected in series and summed, producing a total voltage, $V_{row}$.
Figure 5:
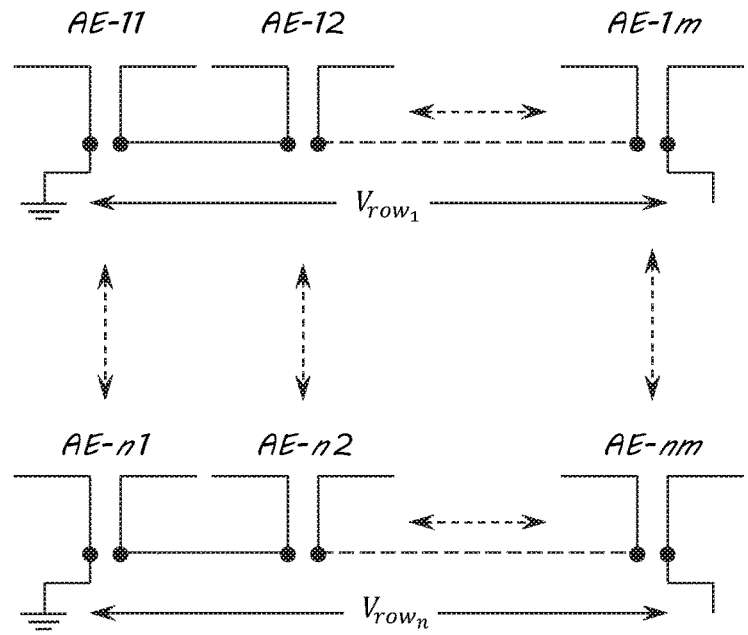
FIG. 5 illustrates a schematic diagram of rows of in-element antennas-transducers, producing a sum row voltage, $V_{row}$, forming an array of n rows.

FIG. 4A is a schematic representation of each antenna element in a 1×m sensor array. Antennas AE-11 through AE-1$m$ (the mth antenna element) each produce their own photovoltage. An equivalent circuit diagram shown in FIG. 4B depicts each of these antenna elements as a voltage source $V_1$ to $V_m$, where m is the last element of the row. These voltage sources are connected in series, producing a total voltage $V_{row}$, which may be read out by pulse capture electronics (such as front end analog circuitry 44 in FIG. 6). In an alternate illustrated embodiment show in FIG. 5, an array is comprised of n rows and m antenna elements, where each row may be tuned to a different wavelength, providing a multi-spectral response out of the n row configuration. Each row may similarly produce a total voltage $V_{row_1}$ through $V_{row_n}$, which may also be read out by pulse capture electronics and then further processed as illustrated in more detail below.

Figure 6:
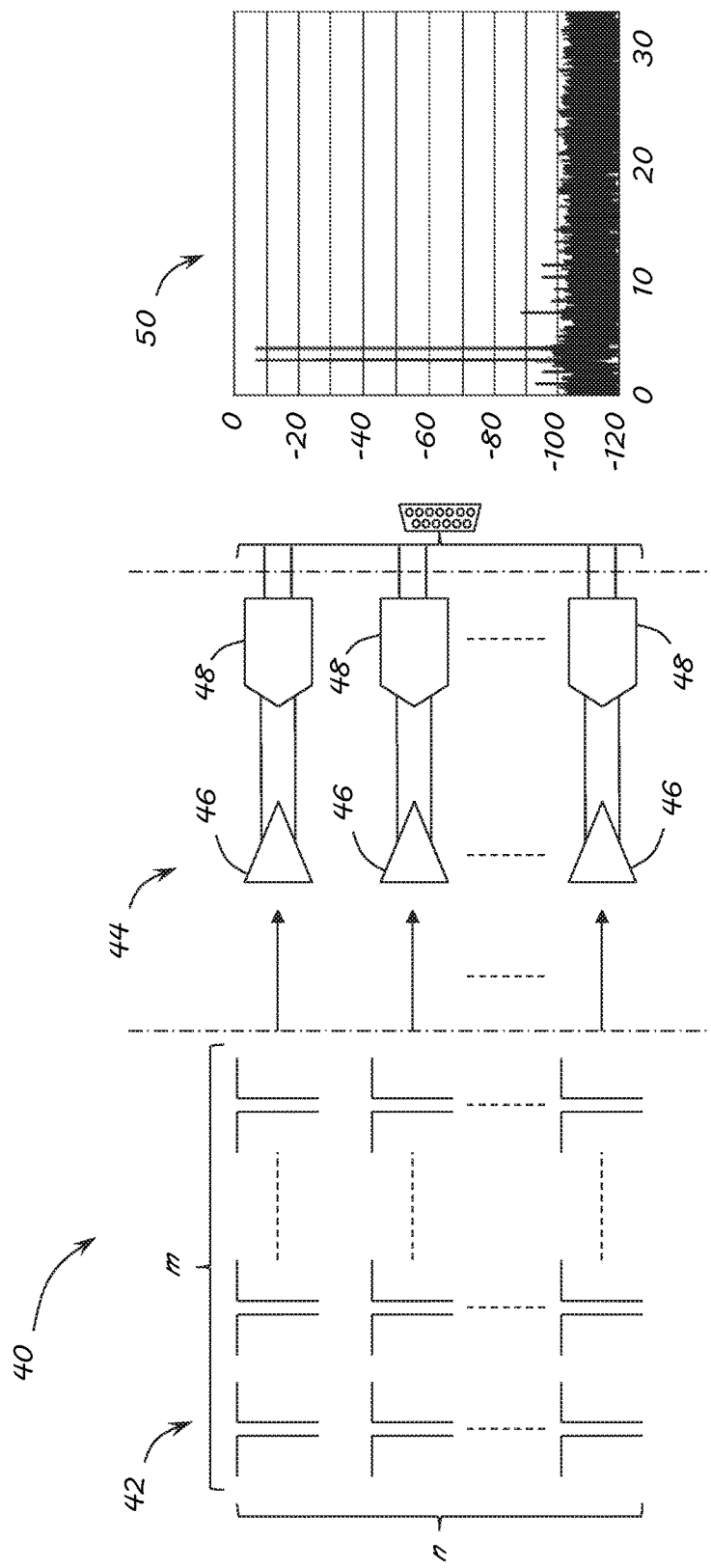
FIG. 6 illustrates a schematic diagram of a high level system including an n×m antenna element array of FIG. 5 designed for threat detection and signal processing.

FIG. 6 illustrates an embodiment of an overall architecture 40 of an antenna system. A detector 42 including n rows with m antenna-transducer elements as illustrated above, where each row is configured to detect a different wavelength, is captured by front end analog circuitry 44. A photovoltage from each row may read and captured by level sensitive electronics 46. Additionally, multichannel analog-to-digital converters (ADCs) 48 may be used to digitize the data for filtering and signal reconstruction. Voltage readouts from each individual row are captured by front end analog circuitry 46. These level sensitive electronics 46 detect changes in DC voltages produced by the rows of antenna elements and amplify them for further processing. Multichannel ADCs 48 will then digitize the data for digital signal processing algorithms. The antenna array 42 front end is geared towards a rapidly evolving point target; therefore, no algorithmic template matching is required. This filtering aspect of the antenna array 42 by design also provides a counter-countermeasure (CCM) against an adversary platform. Any number of multi-spectral algorithms may then be employed for signal processing and reconstruction as illustrated in the graph 50.

By combining, in one detector, arrays of antennas, each resonant at different wavelengths, a sensor with inherent wavelength-selective detection is created. A multi-spectral analysis algorithm targeted for this sensor may perform more efficiently as it does not have to process a large number of spectral bands found in traditional multi or hyper-spectral systems. These systems may have from tens to hundreds of spectral bands producing responses of varying amplitude and shape to a threat or a set of threats. Processing more bands is more challenging as it requires more hardware and time to process the data. This approach is more prone to errors due to the output response of various sources that may be present in the field of view (FOV) and may amplify or attenuate the signal. The end result may result in false alarms or missed targets due to the above mentioned artifacts.

Algorithms working with the embodiments of the invention utilize a reduced data set produced by the sensor in a small number of preselected spectral bands of interest to discriminate a threat in the sensor's FOV. Only one data point per row is collected and a reduced data set may then be developed after discretization of the data. This assists in ensuring maximum system response to a specific threat stimulus for a given spectrum for detection and may also assist in being more isolated from noise and natural artifacts that may corrupt the spectral signature of interest. The multi-spectral algorithm may then correlate the characterization data set to the system response in determination of a target or a threat. The reduced data set also generally requires less processing, translating to less hardware requirements and shorter processing times. Since the antenna itself will behave as a filter for wavelengths of interest, the signal to noise ratio (SNR) will generally be high, increasing the precision and sensitivity of the system. This, in turn, contributes towards efficiency and reduced computational intensity of the algorithm.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. An antenna element comprising:
  a first antenna component;
  a graphene layer proximate the first antenna component;
  a doped, conjugated organic polymer proximate the graphene layer; and
  a second antenna component proximate the doped, conjugated organic polymer forming an organic polymer capacitor between the first and second antenna components.

2. The antenna element of claim 1, wherein the first and second antenna components form connections for respective first and second poles of the antenna element.

3. The antenna element of claim 1, wherein a configuration of the antenna element is selected from a group consisting of: dipole, bow tie, log-periodic, Yagi-Uda, and patch configurations.

4. The antenna element of claim 1, wherein the doped conjugated organic polymer is selected from a group consisting of: polythiophene, polyfluorene, poly(p-phenyleneethynylene), poly(p-phenylene), poly(p-phenylenevinylene), polyaniline, poly(thienylene vinylene), and polypyrrole.

5. The antenna element of claim 4, wherein the doped conjugated organic polymer is polythiophene.

6. The antenna element of claim 1, wherein a dopant for the conjugated organic polymer is selected from a group consisting of: tetrafluoroborate, perchlorate, chloride, bromide, iodide, sodium, tetra-n-butylamine, and photodoping.

7. The antennal element of claim 6, wherein the dopant is tetrafluoroborate anions.

* * * * *